United States Patent Office 3,257,323

Patented June 21, 1966

3,257,323

COMPOSITIONS FOR CONDITIONING AND CLEANING PLANOGRAPHIC PLATES

Gerald F. O'Connor, Ossining, N.Y., assignor to Polychrome Corporation, Yonkers, N.Y.

No Drawing. Filed Sept. 12, 1963, Ser. No. 308,325
3 Claims. (Cl. 252—79.3)

This invention relates to the treatment and maintenance of planographic plates. In particular, the invention relates to a novel composition useful as a plate conditioner.

The art of planographic printing depends upon the immiscibility of grease and water, upon the preferential retention of a greasy image-forming substance by the image areas, and the similar retention of an aqueous dampening fluid by the non-image areas. When a greasy image is imprinted upon a suitable surface, and the entire surface is then moistened with an aqueous solution, the image areas will repel the water, and the non-image areas will retain the water. Upon subsequent applications of greasy ink, the image portion retains ink, whereas the non-image areas will repel it. The image is then transferred to paper, cloth, and so on, via an intermediary, so-called off-set or blanket cylinder, which is necessary to prevent mirror-image printing.

Lithographic plates are typically of two types. Negative plates are those that have a photosensitive coating, usually a diazo compound. When exposed to light through a negative transparency, the light-sensitive material is caused to harden, thereby becoming insoluble in a desensitizing solution which is applied to negative plates after the light exposure for the purpose of removing that part of the light-sensitive coating which, because it was protected from the light by the negative, was not light-hardened. The light-hardened surface of a negative plate will be the oleophilic surface which is compatible with the greasy ink and is called the "image area;" the surface from which the non-hardened light-sensitive material has been removed with desensitizers will be a hydrophilic surface with no affinity for the greasy ink.

A positive plate is one upon which the light-sensitive diazo compound exposed to light remains non-image area while only those surface areas not exposed to light are adapted to be chemically converted to image areas. Therefore, the light-sensitive coatings upon positive plates remain non-image areas and the coating not exposed light is hardened by chemical reaction to form the hydrophilic or ink receptive image areas. Some typical chemical formulae applicable to the chemistry of positive plates follow:

$$(1)\quad R\theta N^{+}\equiv N\cdot + C\equiv N^{-} \rightarrow R\theta{-}N{=}N{-}C\equiv N$$

$$(2)\quad R\theta{-}N{=}N{-}C\equiv N \xrightarrow{\text{light}} R\theta C\equiv N\!: + N_2\uparrow$$

$$(3)\quad R\theta{-}N{=}N{-}C\equiv N + C_{10}H_8OH \xrightarrow{\text{alkali}} R{-}\theta{-}N{=}N{-}C_{10}H_8OH + HCN$$

where $\theta$ is an organic radical substituted with organic groups R. $C_{10}H_8OH$ is a $\beta$-naphthol radical.

The product of reaction (2) is the light-hardened, non-image area. The primary product of reaction (3) forms the image area.

The source of $C\equiv N^{-}$ is potassium ferricyanide, the use of which is disclosed in the copending application of Ibert Mellan, Serial No. 126,502 filed July 25, 1961, now U.S. Patent No. 3,113,023. $\theta$ is representative of any of the chemical groups and radicals that will not interfere in the above reactions, and $C_{10}H_8OH$ is $\beta$-naphthol, a coupler used to chemically harden image areas of positive-acting planographic plates.

There are certain problems derived in using lithographic plates. It is usually economically desirable to obtain a plate which will have the longest possible press life. However, among the conditions that may arise during the press run which will make the continuance of the run either impossible or uneconomical are included the mechanical spreading of the lithographic dots to greater sizes than that originally imparted to the plate or than is desirable for reproducing purposes, the scumming of the plate by a weakening of the hydrophilic nature of the non-image area, or the specking or toning of the plate caused by the intended non-image areas becoming light-sensitized by, for example, undesirable chemical action. In the case of positive plates, this action can be caused by the presence of residual metal compounds remaining after the use of ferricyanide or other such compound.

These problems have no entirely satisfactory solution in the prior act. Although plate cleaners are known in the art, these plate cleaners are alkaline solutions which require, in addition to the treatment of the plate with the cleaner itself, an afterwipe with an acidic compound to neutralize the alkaline cleaner. Furthermore, on positive plates where it becomes necessary, in addition to the normal cleaning problems, to remove the residual metallic compounds, the prior art cleaning compositions are of little use. Even such light-desensitizing agents as tetra potassium pyrophosphate which have been used to sequester the iron ions have limited use inasmuch as much of the iron on the plate is apparently tied up in chemical complexes which are unaffected by such a desensitizing agent and remain on the plate. As the complexes are destroyed in time, the metallic ions are apparently freed, thus producing unwanted image area and ultimately specking and toning on prints where none is desired.

An object of the present invention is to provide a composition that is useful for maintaining planographic plates in suitable condition during extended press runs.

Another object of the invention is to provide a composition particularly useful in the removal of metallic ions such as iron ions and other foreign organic matter from the non-image areas of planographic plates. A further object of the invention is to provide a method for quickly and adequately cleaning planographic plates with a one-step process. A still further object of the invention is to provide compositions that will achieve the foregoing objects and leave the treated plate area in a hydrophilic state.

Applicants have substantially achieved these objects by use of novel compositions comprising hydrogen zirconium fluoride, i.e. hydrofluorozirconic acid. Said compositions also normally comprise film formers and diluents.

These compositions, on being applied to a planographic plate, not only provide a simple one-step cleaning operation and a method for "sharpening" lithographic dots, but also provide an advantageous way for breaking down any organo-metallic complex contaminating the surface of a plate. For example, iron atoms are removed from positive-acting planographic plates by the conditioner, thus preventing the ions from catalysing chemical reactions and sensitizing areas of the plate wherein no image is desired. Besides hydrofluozirconic acid and the diluents and film formers, it is also sometimes beneficial to use such compounds as hexylene glycol to provide a mild ink-solvent action and to include some nitric acid which, in addition to aiding in the destruction of the organo-metallic complexes, provides a helpful indicating effect by virtue of its reaction with iron to form a blue color, thus visually indicating just what parts of an iron-contaminated plate have been treated with the composition and which parts of the plate have not yet been so treated. This is very helpful to an operator who, while hurriedly cleaning the plate, might otherwise miss applying the plate conditioner to some spots on the plate.

It is important to note that the image area on both positive-acting and negative-acting planographic plates remains intact during wiping with the plate conditions of the instant invention. The solvents used in the claimed composition are sufficiently mild so that, while they dissipiate ink which loosely adheres to non-image areas, they do not interfere with the actual image area itself. There are no lacquer solvents included in the composition. Thus the present composition differs markedly from that disclosed in U.S. Serial No. 267,903, filed March 26, 1963.

Hydrogen zironcium fluoride is advantageously used in the instant compositions. However, other materials similar in nature may be used such as the hexavalent fluoride salts of the transition elements of Group 4*b*, hafnium and titanium. However, the preferred material is usually, as stated above, hydrogen zirconium fluoride or hydrofluozirconic acid.

This material may be obtained by the reaction of zirconium tetrafluoride with hydrofluoric acid:

$$ZrF_4+2HF \rightarrow H_2ZrF_6$$

The reaction of a salt of the acid with water in an acid medium is another method of producing the compound. For example:

$$K_2ZrF_6 + H_2O \xrightarrow[H^+]{\text{strong acid}} H_2ZrF_6$$

Phosphoric acid is particularly useful in this latter reaction.

However, hydrofluozirconic acid is commercially available in aqueous solution which is usually most convient in preparing the composition of the instant invention.

Although the hydrogen zirconium fluoride in water solution has utility as a plate conditioner, the composition is advantageously modified by the addition of solvents, film forming compounds and acid additives especially nitric acid as indicated above.

As inert solvents a great number of materials may be used including various hydrocarbons, alcohols, ketones, polyhydroxy compounds such as glycerine and ethylene glycol, water, and various combinations thereof. However, care must be taken to avoid use of solvents which attack the particular protective lacquer used on the planographic plate to be treated. Among the favored inert solvents, because of their mild reactivity and favorable viscosity characteristics, are ethylene glycol and glycerine.

Film forming substances also can be used advantageously in the plate conditioner composition. Water solutions of acrylic derivatives such as those sold under the trade name Acrysol are useful. Other suitable materials include polyoxyethylene-polyoxypropylene copolymers and especially polyoxyethylene-terminated materials. These latter materials are commercially available and are sold under the trade name Pluronic. Many other compounds known to the art are adequate for use in the claimed compositions.

In addition to the inert solvents mentioned above, ink solvents may be added to the composition. Hexylene glycol is an example of such a solvent. The purpose of such ink solvents is to increase the cleaning action and spot sharpening characteristics of the plate conditioner.

Other suitable ink solvents which do not dissolve the lacquer used to protect the image area on the planographic plate are also useful. For example, the blanket washes used in the graphic arts are usually advantageous ink solvents for use with the instant invention.

In order to point out more fully the nature of the present invention, the following specific examples are given as illustrative embodiments of the present products and use thereof:

*Example 1*

A mixture of the following composition was prepared, the ingredients having been added in the order listed:

| | Grams |
|---|---|
| Hydrofluozirconium acid solution (11% of acid in water) | 7.0 |
| Water | 30.0 |
| Glycerine | 31.0 |
| Hexylene glycol | 30.0 |
| Nitric acid | 2.0 |

An aluminum plate 10 inches by 15 inches was prepared in the manner known to the art, i.e. by coating with a diazo layer, treating with a ferricyanide compound, and exposing the plate to light through a photographic transparency, then treating with $\beta$-naphthol to chemically harden the area which had not been exposed to light, forming image area, and thus a positive planographic plate.

This coupling with the $\beta$-naphthol was done in an alkaline medium. Tetra potassium pyrophosphate was used as the alkali. This one-step operation desensitized the plate and enhanced coupling of the positive image.

The plate was stored for one day, then attached to a press again. Prints produced on the aged plate were not satisfactory. Specks and some toning appeared on what was supposed to be non-image area. This specking and toning was apparently due to the chemical hardening of non-image areas by ferric ions.

A second plate was prepared in the same manner as the above-described plate with the exception that the plate conditioner composition described above was used to treat the plate after the plate had been lacquered. The treatment consisted of a light wiping action over the surface of the plate with the conditioner followed by evaporating off the excess conditioner. This second plate gave satisfactory printings immediately after treatment, one day after treatment, and seven days after treatment, indicating the effective desensitizing of the plate by the plate conditioner.

*Example 2*

A positive plate 10 inches by 15 inches and .005-inch thick was prepared according to the procedure in Example 1. This plate was exposed to light through a transparency and thereafter given a protective coating of lacquer. A long black-and-white press run was made with the plate during which time a gradual darkening of a light sky area could be discerned on the print. When the plate conditioner of the formulation in Example 1 was wiped over the plate to clean it and the plate was returned to the press for additional printing, it was observed the original light tone was present in the sky portion of the print. Furthermore, the gradual darkening of the print caused by the mechanical spreading of the lithographic dots took place more slowly after the treatment with the plate conditioner.

*Example 3*

An aluminum offset plate 10 inches by 15 inches and .005-inch thick was coated, consecutively and in the ordinary manner known to the art, with a $K_2ZrF_6$ coating and a light-sensitive diazo compound. This plate was exposed to light through a negative and thereafter given a protective coating of lacquer. A press run of about 1200 copies was carried out at which time some of the hydrophilic areas, i.e. non-image areas on the plate, became ink-contaminated. The press was stopped and the pressman cleaned the ink-soiled areas of the plate without removing the plate from the press. No further discernable ink-soiling occurred in the next 1000 copies. The down-time on the press for this one-step cleaning operation was 15 seconds. The same press operator took 45 seconds on the average to clean plates with the conventional two-step alkaline-acid cleaning methods known in the art.

*Example 4*

A mixture of the following composition was prepared, the ingredients having been added in the order listed:

| | Grams |
|---|---|
| Hydrofluozirconic acid solution (11% of acid in water) | 2.0 |
| Water | 60.0 |
| Ethylene glycol | 15.0 |
| Hexylene glycol | 18.0 |
| Polyoxyethylene-polyoxypropylene copolymer (molecular weight of 4500) | 5.0 |

An aluminum offset plate 10 inches by 15 inches and .005-inch thick was coated, consecutively and in the ordinary manner known to the art, with a $K_2ZrF_6$ coating and a light-sensitive diazo compound. This plate was exposed to light through a negative and thereafter given a protective coating of lacquer. A press run of about 1200 copies was carried out at which time some of the hydrophilic areas, i.e. non-image areas on the plate, became ink-contaminated. The press was stopped and the pressman cleaned the ink-soiled areas of the plate without removing the plate from the press. No further ink-soiling occurred in the next 1000 copies.

*Example 5*

A mixture of the following composition was prepared, the ingredients having been added in the order listed:

| | Grams |
|---|---|
| Hydrofluozirconic acid solution (11% of acid in water) | 14.0 |
| Water | 6.0 |
| Ethylene glycol | 50.0 |
| Polyoxyethylene-polyoxypropylene copolymer (molecular weight of 4500) | 4.0 |
| Hexylene glycol | 30.0 |
| Nitric acid | 6.0 |

An aluminum offset plate 10 inches by 15 inches and .005-inch thick was coated, consecutively and in the ordinary manner known to the art, with a $K_2ZrF_6$ coating and a light-sensitive diazo compound. This plate was exposed to light through a negative and thereafter given a protective coating of lacquer. A press run with the plate was continued until a darkening of the prints took place. This darkening appeared, on inspection of the prints under a microscope, to be due to the enlargement of the lithographic dots.

The above-identified solution was vigorously wiped over the surface of the plate and the plate was returned to the press. Prints subsequently produced had the same light tones as those originally produced.

*Example 6*

A mixture of the following composition was prepared, the ingredients having been added in the order listed:

| | Grams |
|---|---|
| Hydrofluozirconic acid solution (11% of acid in water) | 5.0 |
| Ethylene glycol | 30.0 |
| Glycerine | 30.0 |
| Water | 28.0 |
| Nitric acid | 1.0 |
| Hexylene glycol | 5.0 |

An aluminum plate 10 inches by 15 inches was prepared in the manner known to the art, i.e. by coating with a diazo layer, treating with a ferricyanide compound, and exposing the plate to light through a photographic transparency, then treating with $\beta$-naphthol and tetra potassium pyrophosphate as described in Example 1 to chemically harden the area not exposed to light, and thus forming image area and a positive planographic plate.

The plate was stored for one day, then attached to a press again. The prints produced on the aged plate were not satisfactory. Specks and some toning appeared on what was supposed to be non-image area. This specking and toning was apparently due to the chemical hardening of non-image areas by ferric ions.

A second plate was prepared in the same manner as the above-described plate with the exception that the plate conditioner composition described above was used to treat the plate after the plate had been lacquered. The treatment consisted of wiping the surface of the plate with the conditioner followed by evaporating off the excess conditioner. This second plate gave satisfactory printings immediately after treatment, one day after treatment, and seven days after treatment, indicating the effective desensitizing of the plate by the plate conditioner.

*Example 7*

A mixture of the following composition was prepared, the ingredients having been added in the order listed:

| | Grams |
|---|---|
| Hydrofluozirconic acid solution (11% of acid in water) | 3.0 |
| Water | 70.0 |
| Hexylene glycol | 30.0 |

An aluminum offset plate 10 inches by 15 inches and .005-inch thick was coated, consecutively and in the ordinary manner known to the art, with a $K_2ZrF_6$ coating and a light sensitive diazo compound. This plate was exposed to light through a negative transparency and thereafter given a protective coating of lacquer. A press run of about 1200 copies was carried out at which time some of the hydrophilic areas, i.e. non-image areas on the plate, became ink-contaminated. The press was stopped and the pressman cleaned the ink-soiled areas of the plate without removing the plate from the press. No further ink-soiling occurred in the next 1000 copies.

It is of course to be understood that the foregoing examples are intended to be illustrative and that various changes can be made in the ingredients, proportions, and conditions set forth therein without departing from the spirit of the invention as defined in the appended claims.

I claim:

1. A composition for conditioning and cleaning the non-image areas of finished planographic plates consisting essentially of an aqeuous solution of about 0.22% to about 1.40% of hydrofluozirconic acid and about 29.13% to about 72.72% of a member selected from the group consisting of glycerine, hexylene glycol and ethylene glycol, said percentages being by weight of the total composition.

2 The composition of claim 1 wherein the solvent is hexylene glycol.

3. A composition for conditioning and cleaning the non-image areas of finished planographic plates consisting essentially of an aqueous solution of about 0.22% to about 1.40% of hydrofluozirconic acid, about 29.13% to about 72.72% of a member selected from the group consisting of glycerine, hexylene glycol and ethylene glycol, and up to about 5.45% of nitric acid, said percentages being by weight of the total composition.

(References on following page)

References Cited by the Examiner

UNITED STATES PATENTS

| | | | |
|---|---|---|---|
| 2,719,079 | 9/1955 | Murphy | 252—142 XR |
| 2,780,168 | 2/1957 | Nichols | 252—143 |
| 2,946,683 | 7/1960 | Mellan et al. | 252—79.3 XR |
| 2,977,204 | 3/1961 | Shannon | 252—79.3 XR |
| 3,018,211 | 1/1962 | Duke | 252—79.3 XR |

OTHER REFERENCES

"Hexylene Glycol," Shell Chemical Corp., Technical Booklet SC: 50–1 (1950), p. 15.

Prideaux et al.: "Hydrofluozirconic and . . . Fluoride," Journal of the Chemical Society, 1926, p. 903.

JULIUS GREENWALD, *Primary Examiner.*

M. WEINBLATT, *Assistant Examiner.*